United States Patent [19]

Krüger et al.

[11] Patent Number: 4,663,585
[45] Date of Patent: May 5, 1987

[54] APPARATUS FOR TESTING DIELECTRIC STRENGTH OF MATERIALS

[75] Inventors: Michael Krüger, Muntlix; Josef Baur, Sulz, both of Austria

[73] Assignee: Baur Prüf-und Messtechnik K.G.

[21] Appl. No.: 575,506

[22] Filed: Jan. 31, 1984

[51] Int. Cl.$^4$ ............................................. G01R 31/12
[52] U.S. Cl. ......................................... 324/54; 361/58
[58] Field of Search ............................. 324/54, 61 R; 323/DIG. 908, 301, 303, 247, 311; 361/1, 3, 5–10, 18, 58

[56] References Cited

U.S. PATENT DOCUMENTS

| | | | |
|---|---|---|---|
| 2,166,932 | 7/1939 | Keinath | 324/54 |
| 2,923,879 | 2/1960 | Povey | 324/54 |
| 3,211,998 | 10/1965 | Kidwell | 324/54 |
| 3,286,130 | 11/1966 | Clinton | 324/54 |
| 3,529,210 | 9/1970 | Ito et al. | 361/3 |
| 4,117,397 | 9/1978 | Fukao et al. | 324/54 |
| 4,140,965 | 2/1979 | Neal | 324/54 |

Primary Examiner—Reinhard J. Eisenzopf
Assistant Examiner—Jack B. Harvey
Attorney, Agent, or Firm—Toren, McGeady and Goldberg

[57] ABSTRACT

Apparatus for testing the dielectric strength of insulating and/or cooling media, particularly insulating oils for electrical apparatus and equipment such as transformers, converters, switches or the like wherein a vessel is provided within which the material to be tested may be contained with electrodes providing a spark gap arranged therein being connected to the high voltage side of a testing generator having a transformer and a voltage control device, the internal resistance of the testing generator being made voltage-dependent and increasing with increasing voltage.

8 Claims, 5 Drawing Figures

APPARATUS FOR TESTING DIELECTRIC STRENGTH OF MATERIALS

The present invention relates generally to apparatus for testing the dielectric strength of materials and more particularly to test apparatus for testing the dielectric strength of insulating and/or cooling media, particularly insulating oils for electrical apparatus and equipment such as transformers, converters, switches or the like.

Apparatus of the type to which the present invention relates normally include a vessel within which the material to be tested may be contained, with a spark gap being defined within the vessel by electrodes connected to the high voltage side of a testing generator having a transformer and a voltage control device.

Instruments of the type relating to the present invention are known, for example, from Austrian Pat. No. 333 379. Such instruments comprise a vessel adapted to receive the material to be tested for dielectric strength. Inside the vessel, a spark gap is defined by a pair of electrodes and by means of a variable transformer connected to the spark gap on the high voltage side, the voltage of the spark gap is raised until the voltage level causes puncture at the spark gap. The value of this voltage, referred to as the disruptive voltage, is a measure of the quality of the tested material or medium. Through current flow in the secondary winding occurring during disruptive breakdown, current supply on the primary side to the primary winding of the variable-voltage transformer is interrupted by way of appropriate known control elements.

In order to obtain comparable test data representing the results of such disruptive breakdown testing, test specifications have been evolved which are governed by interstate and also partially by international conventions, which specify that vessel filling is successively loaded to disruptive breakdown several times.

The aforementioned apparatus and also existing test regulations have proved satisfactory. However, difficulties may arise due to the fact that in more recent electrical machines and equipment, the construction thereof in certain cases is such that silicone-based synthetic oils are utilized rather than mineral insulating oils. Such synthetic insulating oils, while exhibiting excellent characteristics with respect to insulating and cooling properties, have nevertheless the disadvantage as compared with mineral oils that in the event of a breakdown, the electrodes of the spark gap will be badly fouled so that after each puncture which occurs in the test apparatus, the electrodes defining the spark gap must be removed and cleaned before a next successive puncture in the test cycle may be accomplished. Failure to do so would lead to unreliable test results. It will be appreciated that the necessity for such continuous cleaning greatly complicates the testing procedure.

As a result of the arc energy which is generated during breakdown, there is formed in the synthetic oils, decomposition products which cannot be removed from the spark gap with agitators which are normally installed in such test equipment. The decomposition products which are formed in the synthetic oils by the arc energy are gel-like and adhere firmly to the electrodes of the spark gap. Accordingly, they require intensive cleaning procedures in order that they may be removed.

It has been found that such decomposition products occur more plentifully as the energy released in the arc during breakdown increases. If the arc energy released upon breakdown is maintained to a smaller level, decomposition products occur in an insignificant degree so that the aforementioned complicated cleaning procedures for the electrodes become unnecessary. Instead, it is possible to conduct a test cycle, which of course will include several successive punctures, without requiring cleaning of the electrodes after each puncture and thereby eliminating the falsification or unreliability of the test results.

In order to maintain the arc energy level low during breakdown and thereby to suppress the formation of such gel-like decomposition products which may adversely affect the integrity of the test results, it would be appropriate to design the testing transformer with an internal resistance which is as high as possible. However, this would conflict with the requirement that the short circuit current during puncture at the spark gap of the testing device must, in accordance with the aforementioned testing specifications (for example in accordance with VDE 0370) be at least 20 mA for voltage higher than 15 kV. This requirement derives from the fact that if the internal resistance of the testing device is too high and hence the short circuit current too small, an arc cannot always immediately form during breakdown from one electrode to the other. As a result, only a partial puncture may occur inasmuch as, due to the high internal resistance, the voltage will collapse. As a result of this effect, false or unreliable breakdown values would then be obtained.

The present invention is directed toward overcoming the aforementioned conflicting requirements and is intended to solve the problems involved. In accordance with the invention, apparatus is provided wherein the internal resistance of the testing generator is made voltage-dependent and caused to increase with increasing voltage.

SUMMARY OF THE INVENTION

Briefly, the present invention may be described as apparatus for testing the dielectric strength of materials such as insulating and/or cooling media particularly insulating oils for electrical apparatus and equipment such as transformers, converters, switches or the like comprising a vessel within which the materials to be tested may be contained, electrode means defining within said vessel a spark gap extending through said materials to be tested, testing generator means including transformer means having said electrode means connected thereto for developing a test voltage across said spark gap, voltage control means and resistor means defining the internal resistance of said testing generator means, said resistor means being voltage-dependent with the resistance thereof increasing with increasing voltage.

Thus, with the present invention, as the test voltage increases, the internal resistance of the testing generator which is made voltage-dependent will also increase. This may be accomplished by means of ohmic and/or inductive resistances. It is possible in this connection either to switch in or add resistors singly with increasing or rising voltage or, at a corresponding cost with regard to more complex circuitry, the resistance can be made to increase continuously with rising voltage.

The various features of novelty which characterize the invention are pointed out with particularity in the claims annexed to and forming a part of this disclosure. For a better understanding of the invention, its operating advantages and specific objects attained by its use, reference should be had to the accompanying drawings and descriptive matter in which there are illustrated and described preferred embodiments of the invention.

DETAILED DESCRIPTION OF THE PREFERRED EMBODIMENTS

Figure 1:
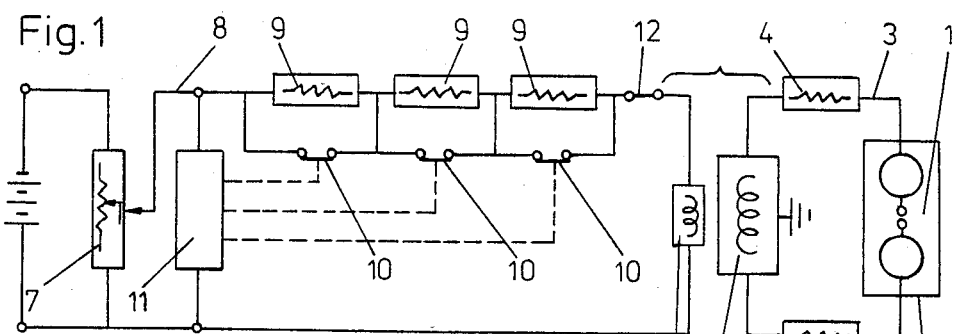
FIGS. 1-5 represent schematic circuit diagrams of circuit arrangements embodying the present invention.

Referring now to the drawings, and more particularly to FIG. 1, there is shown in FIG. 1 a first embodiment of the invention wherein electrode means are provided to define a spark gap 1 which is disposed within a vessel 2 within which the medium to be tested is contained. The electrodes defining the spark gap 1 are connected by means of lines 3 through protective resistors 4 on the high voltage side to a secondary winding 5 of a transformer including a primary winding 6.

The primary winding 6 is fed on the power supply side and a variable-voltage transformer or potentiometer 7 is used for raising the test voltage.

The transformer including the windings 5 and 6 and a control device for raising the test voltage are referred to as the testing generator or testing generator means.

A line 8 leading to the primary winding 6 of the variable voltage transformer has connected therein a number of resistors 9 which are connected in series, with each resistor 9 being capable of being short circuited by means of a switch 10 arranged parallel thereto.

A control device 11 connected across the variable primary voltage is functionally connected with the individual switches 10 in such a manner that at low voltage all the switches 10 will be closed by operation of the control device 11.

If during the testing operation, the test voltage gradually rises, the switches 10 will be successively opened with increasing voltage so that in the range wherein the breakdown may occur at the spark gap, several or even all of the resistors 9 will be connected in the circuit portion defined through the lead 8 to the primary winding 6.

By providing resistors 9 having an appropriate rating, it will be possible for the short circuit current to be maintained to be at least 20 mA as required by testing regulations at voltages higher than 15 kV and it will also be possible thereby for the short circuit current not to exceed required levels at higher test voltages or to do so only insignificantly depending upon the rating of the resistors. Thus, as has been determined by testing, the formation of the initially described decomposition products in the synthetic oils may be successfully reduced to such an extent that normal measurement is possible.

In the case of disruptive breakdown, the short circuit current flowing in the secondary winding will open a switch 12 by appropriate control elements (not shown) thereby interrupting further power supply to the primary winding 6. This is also the case with conventional testing devices of this kind so that control of the switch 12 need not be described in greater detail since such controls are in accordance with devices known to those skilled in the art.

Figure 2:
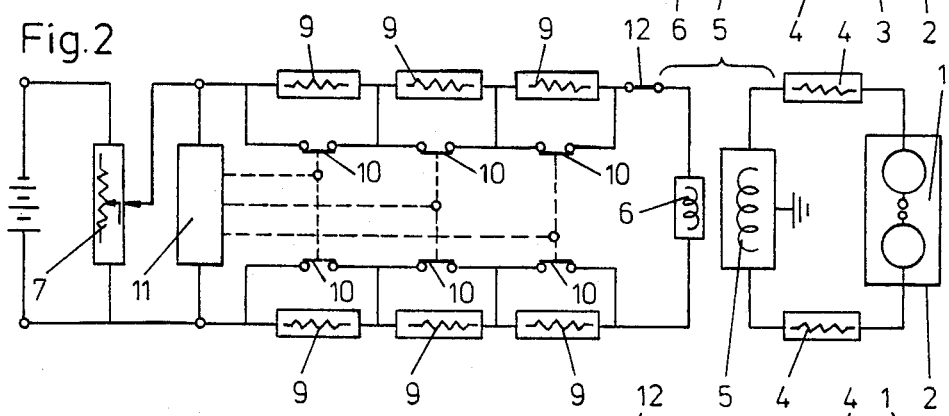

A system in accordance with the present invention having a symmetrical arrangement of elements is shown in FIG. 2. The circuit shown schematically in FIG. 2 has elements identified with reference numerals similar to those used in FIG. 1 in order to designate similar parts. The resistors 9 and the switches 10 correlated therewith and in parallel thereto have been provided in a symmetrical arrangement and in pairs and they are also actuated symmetrically by the control device 11.

The resistances which are shown in the schematic diagrams of FIGS. 1 and 2 are ohmic resistances. Resistance increase with rising voltage is intermittent in this circuit arrangement; that is, the internal resistance of the variable voltage transformer increases in a stepwise manner with rising voltage. The magnitude of the individual steps of the increase of the internal resistance depends upon the rating of the resistors, and the number thereof can be increased or reduced as necessary. The resistors arranged in series in a line section may be rated with the same rating in each instance but alternatively resistors of different size may be connected in series.

Figure 3:
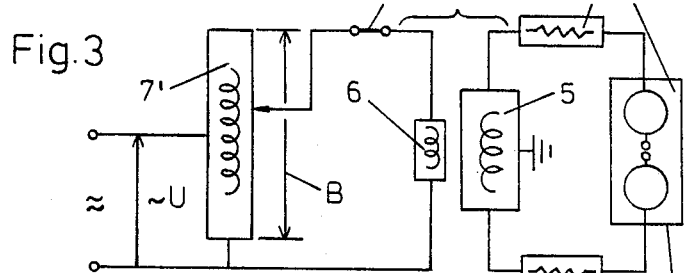

An appropriate possibility for control of the system with inductive means is shown in FIG. 3. In the device of FIG. 3, a winding 7' serves for voltage control and is formed as a winding open on one side where a power supply U, possibly having voltage reduced as against the usual line voltage, of this winding comprises fewer turns than a zone B passable for the control of the voltage. When raising the primary voltage to feed the primary winding 6, the internal resistance of the transformer is considerably increased, namely by the economy variable-voltage transformer which is here utilized. As the primary voltage increases, more and more turns of the winding 7' are included in the circuit and thereby the short circuit resistance of the transformer is increased.

Figure 4:
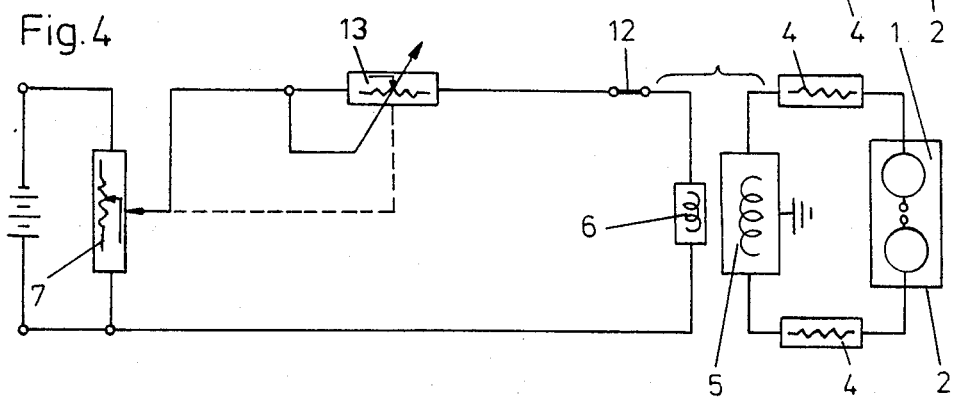

In FIG. 4 there is shown a further embodiment of the invention wherein it is evident that for varying the resistance a potentiometer 13 or a variable choke may also be utilized. Such a potentiometer 13 or possibly variable choke can be coupled for example coaxially with the variable voltage transformer 7 so that at rising voltage levels the resistance in the potentiometer or choke can simultaneously increase accordingly.

Figure 5:
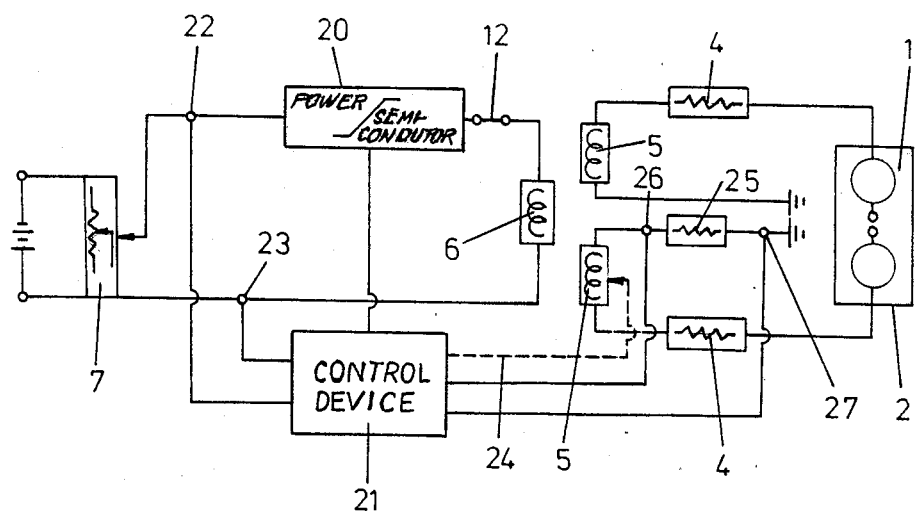

A further embodiment of the invention is shown in FIG. 5 which comprises a circuit wherein a power semiconductor 20, for example a power transistor, is provided as the variable resistance in the primary winding of the transformer. The forward resistance of the power semiconductor 20 is controlled to be voltage-dependent. The control device 21 for control of the power semiconductor 20 is connected either to the primary side of the transformer at junction points 22, 23 or it is also possible to derive from the secondary voltage the actuating variable for the control device 21 and hence for the power semiconductor 20. This is indicated in FIG. 5 by the broken line 24. In the secondary winding of the transformer, there is also provided an ohmic resistance 25 having a voltage tap at the junction points 26 and 27. With the voltage which is taken off at this point, current supply to the primary side of the transformer is entirely cut off by means of the control device 21 and the power semiconductor 20 in the case of spark over.

When the terms insulating and/or cooling media are utilized herein, it is intended, of course, to include all gaseous, liquid, or solid media which meet insulation and/or cooling requirements typical for materials to be tested.

As proposed in accordance with the present invention, by connecting within the circuit resistances of an ohmic and/or inductive nature as a function of the increase of the primary voltage of the primary winding of the transformer, synthetic insulating media may also be tested in compliance with standard specifications without there arising a necessity for complicated or costly cleaning of the spark gap electrodes after each disruptive breakdown.

It will be understood that the embodiments shown and described herein are not intended as limited to ohmic and/or inductive resistances.

Furthermore, in accordance with the present invention, the winding of the primary side of the transformer serving for voltage control (a variable-voltage transformer) may be formed as an open winding and the power supply side feed of this winding may be formed to comprise fewer turns than the zone for passing control of the voltage (economy or autotransformer) so that at low primary feed voltage fewer windings, but at high feed voltage numerous turns of the winding, will lie in the circuit of the primary winding, as shown in FIG. 3.

Furthermore, in the primary winding of the transformer, at least one power semiconductor, which may be a power transistor, is provided and the variable forward resistance thereof is controlled by the primary or secondary voltage and, in the secondary winding of the transformer, an ohmic resistance is arranged with the voltage drop being taken off at this resistance serving to control interruption of current supply in the primary winding of the transformer in accordance with the embodiment shown in FIG. 5.

While specific embodiments of the invention have been shown and described in detail to illustrate the application of the inventive principles, it will be understood that the invention may be embodied otherwise without departing from such principles.

What is claimed is:

1. Apparatus for testing the dielectric strength of material, particularly insulating materials for electrical equipment, comprising: a vessel within which the material to be tested may be contained; electrode means defining within said vessel a spark gap extending through said material to be tested; testing generator means including transformer means having said electrode means connected thereto for developing a test voltage across said spark gap; voltage control means for controlling said test voltage; and resistor means defining the internal resistance of said testing generator means, said resistor means being voltage-dependent with said resistance thereof increasing with increasing voltage; said transformer means including a primary and a secondary winding, said primary winding of said transformer means including several series-connected resistors, each of said resistors being provided with a switch connected in parallel thereto, said switches being opened successively with increasing voltage to increase the internal resistance of said testing apparatus as the voltage across said spark gap increases.

2. Apparatus according to claim 1 wherein said resistors are arranged symmetrically relative to said primary winding of said transformer means, said resistors being connected in pairs with increasing voltage by said switches arranged parallel therewith.

3. Apparatus for testing the dielectric strength of material, particularly insulating materials for electrical equipment, comprising: a vessel within which the material to be tested may be contained; electrode means defining within said vessel a spark gap extending through said material to be tested; testing generator means including transformer means having said electrode means connected thereto for developing a test voltage across said gap; voltage control means for controlling said test voltage; and resistor means defining the internal resistance of said testing generator means, said resistor means being voltage-dependent with said resistance thereof increasing with increasing voltage in order to increase the short circuit impedance of said apparatus as the voltage across said spark gap increases; said transformer means comprising a variable-voltage transformer having a primary side winding serving for voltage control formed as an open winding, said apparatus including power supply side feed of said winding comprising fewer turns than the side thereof for control of said voltage, said primary winding being arranged so that at low primary voltage fewer turns lie in the circuit thereof and so that at high feed voltage numerous turns lie in the winding thereof.

4. Apparatus for testing the dielectric strength of material, particularly insulating materials for electrical equipment, comprising: a vessel within which the material to be tested may be contained: electrode means defining within said vessel a spark gap extending through said material to be tested; testing generator means including transformer means having said electrode means connected thereto for developing a test voltage across said spark gap; voltage control means for controlling said test voltage; and resistor means defining the internal resistance of said testing generator means, said resistor means being voltage-dependent with said resistance thereof increasing with increasing voltage in order to increase the short circuit impedance of said apparatus as the voltage across said spark gap increases; said transformer means comprising a primary winding having at least one power semiconductor therein, said power semiconductor having a variable forward resistance which is controlled by a primary or secondary voltage and wherein said transformer means includes a secondary winding having an ohmic resistance arranged therein, with the voltage drop being taken off at this resistance serving to control interruption of current supply in the primary winding of said transformer means.

5. Apparatus consisting of a circuit arrangement for testing the dielectric strength of material, particularly insulating material for electrical equipment such as insulating oils including a container having electrode means therein defining a spark gap extending through said material to be tested and transformer means with said spark gap connected to a high tension side of said transformer means, the improvement comprising that the short circuit impedance of the circuit arrangement is changeable as a function of voltage and increases with increasing voltage.

6. Apparatus according to claim 5, wherein several resistances connected in series are provided in a primary circuit of said transformer means, wherein a switch is arranged in parallel with each of said resistances and wherein these circuits are opened in sequence with increasing voltage for increasing the resistance of the circuit arrangement with a transformer.

7. Apparatus according to claim 6, wherein said resistances are arranged symmetrically to a primary winding of said transformer means and wherein said resistances are switched into the circuit in pairs with increasing voltage by switches arranged parallel to them.

8. Apparatus for testing the dielectric strength of material, particularly insulating material for electrical equipment, comprising:
- a vessel within which the material to be tested may be contained;
- electrode means defining within said vessel a spark gap extending through said material to be tested;
- testing generator means including transformer means for developing a test voltage across said spark gap, said transformer means including a secondary winding having said electrode means connected in circuit therewith and a primary winding;
- voltage control means for controlling said test voltage, said voltage control means including a plurality of series-connected resistors connected in circuit with said primary winding, a plurality of switches each connected in parallel with said series-connected resistors and a control device operating to open said switches sequentially with increasing levels of voltage across said spark gap in order to sequentially increase the internal impedance of said apparatus as the voltage across said electrode means increases.

* * * * *